US010983634B2

(12) United States Patent
Tang et al.

(10) Patent No.: US 10,983,634 B2
(45) Date of Patent: Apr. 20, 2021

(54) TOUCH ARRAY SUBSTRATE AND TOUCH DISPLAY PANEL

(71) Applicant: Wuhan China Star Optoelectronics Technology Co., Ltd., Hubei (CN)

(72) Inventors: Wei Tang, Hubei (CN); Gaiping Lu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 230 days.

(21) Appl. No.: 16/327,249

(22) PCT Filed: Dec. 15, 2018

(86) PCT No.: PCT/CN2018/121359
§ 371 (c)(1),
(2) Date: Feb. 21, 2019

(87) PCT Pub. No.: WO2020/082544
PCT Pub. Date: Apr. 30, 2020

(65) Prior Publication Data
US 2021/0004119 A1    Jan. 7, 2021

(30) Foreign Application Priority Data

Oct. 26, 2018  (CN) .......................... 201811261029.X

(51) Int. Cl.
*G06F 3/041* (2006.01)
*G02F 1/1333* (2006.01)
(Continued)

(52) U.S. Cl.
CPC .......... *G06F 3/0418* (2013.01); *G02F 1/1368* (2013.01); *G02F 1/13338* (2013.01);
(Continued)

(58) Field of Classification Search
USPC ...... 345/156, 173, 174, 204; 349/42; 257/43
See application file for complete search history.

(56) References Cited

U.S. PATENT DOCUMENTS

2014/0160385 A1* 6/2014 Yamazaki ......... G02F 1/136286
349/42
2015/0214255 A1* 7/2015 Chikama ................. H01L 29/45
257/43

(Continued)

*Primary Examiner* — Thuy N Pardo
(74) *Attorney, Agent, or Firm* — Hamre, Schumann, Mueller & Larson, P.C.

(57) ABSTRACT

A touch array substrate and a touch display panel are provided, including a base substrate, a TFT layer, a flat layer, a metal wiring layer, an insulating layer, a bottom transparent electrode, a passivation layer and a top transparent electrode. The metal wiring layer includes a touch signal line, a dummy wiring and a connection wiring connecting the touch signal line and the dummy wiring. The critical dimension of the connection wiring is smaller than the critical dimensions of the touch signal line and the dummy wiring, or a portion of the connection wiring close to the first via is bent away from the first via, to enlarge the distance between the connection wiring and the first via. The connection wiring is prevented from falling into the first via and contacting the TFT layer, and the top transparent electrode and the bottom transparent electrode are prevented from being directly short-circuited.

14 Claims, 2 Drawing Sheets

(51) Int. Cl.
*G02F 1/1343* (2006.01)
*G02F 1/1362* (2006.01)
*G02F 1/1368* (2006.01)
*H01L 27/12* (2006.01)
*H01L 29/786* (2006.01)

(52) U.S. Cl.
CPC .... *G02F 1/13439* (2013.01); *G02F 1/133345* (2013.01); *G02F 1/134309* (2013.01); *G02F 1/136209* (2013.01); *G02F 1/136286* (2013.01); *G06F 3/0412* (2013.01); *H01L 27/1244* (2013.01); *H01L 29/78621* (2013.01); *H01L 29/78633* (2013.01)

(56) References Cited

U.S. PATENT DOCUMENTS

| | | | | |
|---|---|---|---|---|
| 2016/0358943 | A1* | 12/2016 | Okada | H01L 29/42356 |
| 2017/0052398 | A1* | 2/2017 | Yamazaki | H01L 27/12 |
| 2017/0357369 | A1* | 12/2017 | Liu | G06F 3/0443 |
| 2017/0363903 | A1* | 12/2017 | Jung | G02F 1/13452 |
| 2018/0062090 | A1* | 3/2018 | Kim | H01L 27/3276 |
| 2018/0210587 | A1* | 7/2018 | Zhang | G06F 3/0443 |
| 2019/0265835 | A1* | 8/2019 | Shin | G06F 3/04166 |
| 2020/0119306 | A1* | 4/2020 | Narutaki | G09F 9/46 |

\* cited by examiner

TOUCH ARRAY SUBSTRATE AND TOUCH DISPLAY PANEL

FIELD OF INVENTION

The present invention relates to the field of display technologies, and in particular, to a touch array substrate and a touch display panel.

BACKGROUND OF INVENTION

Thin Film Transistor (TFT) is the main driving component in current Liquid Crystal Display (LCD) and Active Matrix Organic Light-Emitting Diode (AMOLED) devices. It is directly related to the display performance of the flat panel display device.

Most of the liquid crystal displays on the market are backlight type liquid crystal displays, which include liquid crystal display panels and backlight modules. The working principle of the liquid crystal display panel is to fill liquid crystal molecules between a Thin Film Transistor Array Substrate (TFT Array Substrate) and a Color Filter (CF) substrate, and to apply pixel voltage and common voltage respectively on the two substrates. The rotation direction of the liquid crystal molecules is controlled by an electric field formed between the pixel voltage and the common voltage to transmit the light of the backlight module to generate a picture.

According to different structures, the touch display panels can be divided into: the touch circuit covering on the liquid crystal cell (On Cell), the touch circuit embedded in the liquid crystal cell (In Cell), and the external type. The embedded touch display panel has the advantages of lower cost and thinner thickness, and is favored by major panel manufacturers, so that it has evolved into the main development direction of the future touch technology. Referring to FIG. 1, it is a schematic cross-sectional view of a current in-cell touch array substrate. Mostly at present, the In-Cell Touch uses a bottom transparent electrode (BITO) as a touch signal electrode, a top transparent electrode (TITO) as a pixel electrode, and a separate metal (Metal) line as a touch (Touch) signal line. The touch signal lines are mostly made of independent metal wiring layers (M3).

In order to ensure the critical dimension (CD) uniformity of the display (AA) area (M3), M3 needs to be evenly distributed in the AA area, and the M3 includes a touch signal line and dummy (Dummy) wiring, the dummy wiring being in a floating state and longitudinally running through the entire AA area. In order to avoid static electricity accumulation in the dummy wiring, the dummy wiring should be in contact with BITO. But, some of the dummy wiring is just in the BITO longitudinal free position (i.e., there is no BITO above the dummy wiring), so the dummy wiring cannot pass through the via of the insulating layer to contact with the BITO. In the prior art, it is by the dummy wiring in short-circuited contact with the adjacent touch signal line (the touch signal line can be in contact with the BITO through the via of the insulating layer) to avoid the dummy-wiring floating. However, the connection wiring for the short-circuited connection is very close to the via of the flat layer (PLN) under the insulating layer due to the limited position. When the M3 key size is too large or the overlay mark for accurate measuring is slightly offset, the connection wiring is likely to fall into the via of the PLN and so the M3 and the second metal layer (M2) are short-circuited. Since M3 is connected to BITO and M2 is connected to TITO, that is, BITO and TITO are directly short-circuited, this situation results in the poor touch control on the display panel.

SUMMARY OF INVENTION

An object of the present invention is to provide a touch array substrate, which can prevent the top transparent electrode and the bottom transparent electrode from being directly short-circuited, thereby causing poor touch control of the display panel.

Another object of the present invention is to provide a touch display substrate, which can prevent the top transparent electrode and the bottom transparent electrode from being directly short-circuited, thereby causing poor touch control of the display panel.

To achieve the above objectives, the invention provides a touch array substrate, comprising: a base substrate, a TFT layer disposed on the base substrate, a flat layer disposed on the TFT layer, a metal wiring layer disposed on the flat layer, an insulating layer disposed on the metal wiring layer, a bottom transparent electrode disposed on the insulating layer, a passivation layer disposed on the bottom transparent electrode and a top transparent electrode disposed on the passivation layer.

The top transparent electrode is in contact with the TFT layer through a first via penetrating the flat layer, a second via penetrating the insulating layer, and a third via penetrating the passivation layer.

The metal wiring layer includes a touch signal line, a dummy wiring and a connection wiring connecting the touch signal line and the dummy wiring.

The bottom transparent electrode is in contact with the touch signal line through the fourth via penetrating the insulating layer.

The critical dimension of the connection wiring is smaller than the critical dimensions of the touch signal line and the dummy wiring to increase the distance between the connection wiring and the first via. Alternatively, a portion of the connection wiring close to the first via is bent away from the first via to enlarge the distance between the connection wiring and the first via.

The bottom transparent electrode includes a plurality of chip electrodes spaced apart from each other, and the dummy wiring is located at a gap between adjacent two chip electrodes.

The TFT layer includes an active layer disposed on the base substrate, a gate insulating layer disposed on the edge layer, a gate electrode disposed on the gate insulating layer, an interlayer insulating layer disposed on the gate electrode, and a source electrode and a drain electrode disposed on the interlayer insulating layer.

The active layer includes a channel region under the gate, ion lightly doped regions on both sides of the channel region, and a source contact region and a drain contact region on both sides of the ion lightly doped regions, respectively. The source electrode is in contact with the source contact region through the fifth via penetrating the interlayer insulating layer and the gate insulating layer; the drain electrode is in contact with the drain contact region through the sixth via penetrating the interlayer insulating layer and the gate insulating layer.

The top transparent electrode is in contact with the drain electrode in the TFT layer.

The base substrate is further provided with a light shielding layer under the active layer.

The connection wiring is located above the gate electrode.

The connection wiring includes a first portion connecting the touch signal line, a second portion connecting the dummy wiring, and the third portion connecting the first portion and the second portion and bent away from the first via.

The first portion and the second portion of the connection wiring are both located above the gate electrode, and the third portion of the connection wiring is located above the light shielding layer, The present invention further provides a touch display panel comprising the above touch array substrate.

The beneficial effects of the invention are as follows. The touch array substrate of the present invention comprises: a base substrate, a TFT layer disposed on the base substrate, a flat layer disposed on the TFT layer, a metal wiring layer disposed on the flat layer, an insulating layer disposed on the metal wiring layer, a bottom transparent electrode disposed on the insulating layer, a passivation layer disposed on the bottom transparent electrode and a top transparent electrode disposed on the passivation layer. The top transparent electrode is in contact with the TFT layer through a first via penetrating the flat layer, a second via penetrating the insulating layer, and a third via penetrating the passivation layer. The metal wiring layer includes a touch signal line, a dummy wiring and a connection wiring connecting the touch signal line and the dummy wiring. The bottom transparent electrode is in contact with the touch signal line through the fourth via penetrating the insulating layer. The critical dimension of the connection wiring is smaller than the critical dimensions of the touch signal line and the dummy wiring to increase the distance between the connection wiring and the first via. Alternatively, a portion of the connection wiring close to the first via is bent away from the first via to enlarge the distance between the connection wiring and the first via. It is to prevent the connection wiring from falling into the first via and contacting the TFT layer, and to prevent the top transparent electrode and the bottom transparent electrode from being directly short-circuited, thereby causing poor touch control of the display panel. The touch display panel of the invention can prevent the top transparent electrode and the bottom transparent electrode from being directly short-circuited, thereby causing poor touch control of the display panel.

DESCRIPTION OF DRAWINGS

For a better understanding of the features and technical aspects of the present invention, the following detailed description and drawings regarding the present invention should be referred to. The drawings are provided for purposes of illustration and description only and are not intended to limit the invention.

In the drawings.

DETAILED DESCRIPTION OF PREFERRED EMBODIMENTS

In order to further clarify the technical means and effects of the present invention, the following detailed description will be made in conjunction with the preferred embodiments of the invention and the accompanying drawings.

Figure 1:
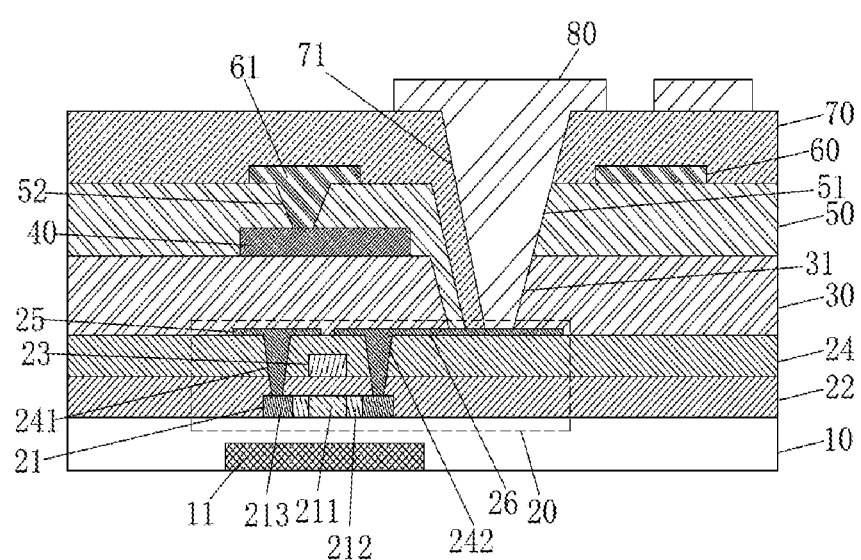
FIG. 1 is a schematic cross-sectional view of a touch array substrate of the present invention.
Figure 2:
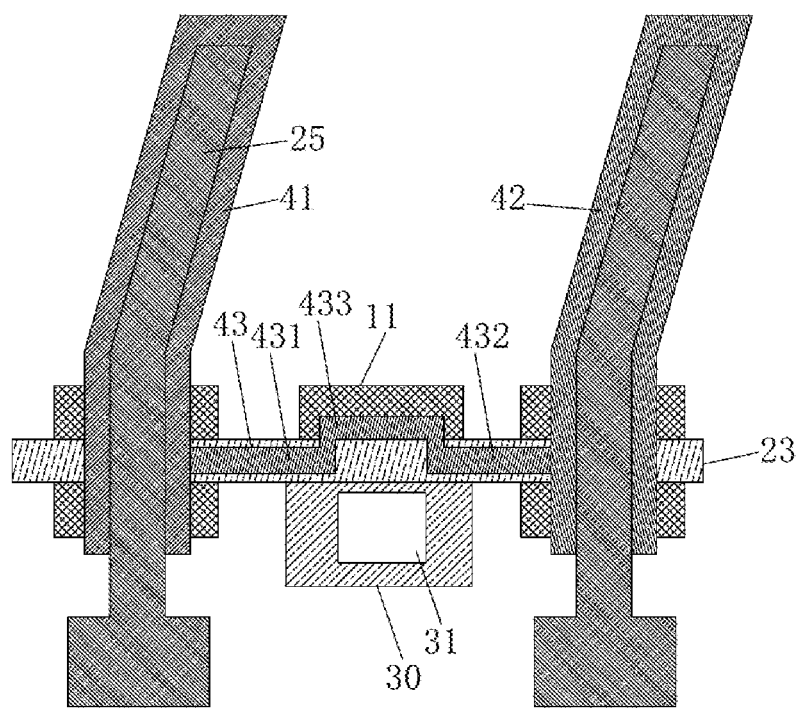
FIG. 2 is a schematic top view of a touch array substrate of the present invention.

Referring to FIG. 1 and FIG. 2, the invention provides a touch array substrate, comprising: a base substrate 10, a TFT layer 20 disposed on the base substrate 10, a flat layer 30 disposed on the TFT layer 20, a metal wiring layer 40 disposed on the flat layer 30, an insulating layer 50 disposed on the metal wiring layer 40, a bottom transparent electrode 60 disposed on the insulating layer 50, a passivation layer 70 disposed on the bottom transparent electrode 60 and a top transparent electrode 80 disposed on the passivation layer 70.

The top transparent electrode 80 is in contact with the TFT layer 20 through a first via 31 penetrating the flat layer 30, a second via 51 penetrating the insulating layer 50, and a third via 71 penetrating the passivation layer 70.

The metal wiring layer 40 includes a touch signal line 41, a dummy wiring 42 and a connection wiring 43 connecting the touch signal line 41 and the dummy wiring 42.

The bottom transparent electrode 60 is in contact with the touch signal line 41 through the fourth via 52 penetrating the insulating layer 50.

The critical dimension of the connection wiring 43 is smaller than the critical dimensions of the touch signal line 41 and the dummy wiring 42 to increase the distance between the connection wiring 43 and the first via 31. Alternatively, a portion of the connection wiring 43 close to the first via 31 is bent away from the first via 31 to enlarge the distance between the connection wiring 43 and the first via 31.

It should be noted that, in order to ensure the critical dimension uniformity of the metal wiring layer 40 (the critical dimension refers to the line width of the wiring), the dummy wiring 42 is disposed in the metal wiring layer 40, and the bottom transparent electrode 60 is in contact with the touch signal line 41 to receive the touch signal, In order to prevent the dummy wiring 42 from being placed in empty space and accumulating static electricity, the present invention provides a connection wiring 43 in the metal wiring layer 40 to connect the touch signal line 41 and the dummy wiring 42 to make the dummy wiring 42 connect with the bottom transparent electrode 60. However, the position of the connection wiring 43 is limited so the distance from the first via 31 is very close. Since the connection wiring 43 is only used to connect the touch signal line 41 and the dummy wiring 42, the critical dimension uniformity of the metal wiring layer 40 is not greatly affected, so that the critical dimension of the connection wiring 43 can be reduced. Alternatively, a portion of the connection wiring 43 close to the first via 31 is bent away from the first via 31 to enlarge the distance between the connection wiring 43 and the first via 31. It is to prevent the connection wiring 43 from falling into the first via 31 and contacting the TFT layer 20, and to prevent the top transparent electrode 80 and the bottom transparent electrode 60 from being directly short-circuited, thereby causing poor touch control of the display panel.

Specifically, the bottom transparent electrode 60 includes a plurality of chip electrodes 61 spaced apart from each other, and the dummy wiring 42 is located at a gap between adjacent two chip electrodes 61 (i.e., there is no bottom transparent electrode 60 above the dummy wiring 42). Therefore, the dummy wiring 42 cannot be directly connected to the bottom transparent electrode 60 through the opening, and the connection wiring 43 is required to connect the dummy wiring 42 and the touch signal line 41 to enable the dummy wiring 42 to connect to the bottom transparent electrode 60.

Specifically, the connection wiring 43 includes a first portion 431 connecting the touch signal line 41, a second portion 432 connecting the dummy wiring 42, and the third portion 433 connecting the first portion 431 and the second portion 432 and bent away from the first via 31.

Specifically, the TFT layer 20 includes an active layer 21 disposed on the base substrate 10, a gate insulating layer 22 disposed on the edge layer 21, a gate electrode 23 disposed on the gate insulating layer 22, an interlayer insulating layer 24 disposed on the gate electrode 23, and a source electrode 25 and a drain electrode 26 disposed on the interlayer insulating layer 24.

Further, the active layer 21 includes a channel region 211 under the gate 23, ion lightly doped regions 212 on both sides of the channel region 211, and a source contact region 213 and a drain contact region 214 on both sides of the ion lightly doped regions 212, respectively. The source electrode 25 is in contact with the source contact region 213 through the fifth via 241 penetrating the interlayer insulating layer 24 and the gate insulating layer 22; the drain electrode 26 is in contact with the drain contact region 214 through the sixth via 242 penetrating the interlayer insulating layer 24 and the gate insulating layer 22.

Specifically, the top transparent electrode 80 is in contact with the drain electrode 26 in the TFT layer 20.

Specifically, the base substrate 10 is further provided with a light shielding layer 11 under the active layer 21 for blocking light leakage.

Further, when the critical dimension of the connection wiring 43 is smaller than the critical dimensions of the touch signal line 41 and the dummy wiring 42 to increase the distance between the connection wiring 43 and the first via 31, the connection wiring 43 is located above the gate electrode 23. Subsequently, when the composed box of the touch array substrate and the color filter substrate is a display panel, the black matrix on the color filter substrate can block the gate electrode 23 and the connection wiring 43 to prevent the connection wiring 43 from reducing the aperture ratio.

Further, when a portion of the connection wiring 43 close to the first via 31 is bent away from the first via 31 to enlarge the distance between the connection wiring 43 and the first via 31, the first portion 431 and the second portion 432 of the connection wiring 43 are both located above the gate electrode 23, and the third portion 433 of the connection wiring 43 is located above the light shielding layer 11, to make the third portion 433 be also blocked by the light shielding layer 11 so as not to lower the aperture ratio when the third portion 433 is bent away from the first via 31.

Based on the above touch array substrate, the present invention further provides a touch display panel comprising the above touch array substrate.

In summary, the touch array substrate of the present invention comprises: a base substrate, a TFT layer disposed on the base substrate, a flat layer disposed on the TFT layer, a metal wiring layer disposed on the flat layer, an insulating layer disposed on the metal wiring layer, a bottom transparent electrode disposed on the insulating layer, a passivation layer disposed on the bottom transparent electrode and a top transparent electrode disposed on the passivation layer. The top transparent electrode is in contact with the TFT layer through a first via penetrating the flat layer, a second via penetrating the insulating layer, and a third via penetrating the passivation layer. The metal wiring layer includes a touch signal line, a dummy wiring and a connection wiring connecting the touch signal line and the dummy wiring. The bottom transparent electrode is in contact with the touch signal line through the fourth via penetrating the insulating layer. The critical dimension of the connection wiring is smaller than the critical dimensions of the touch signal line and the dummy wiring to increase the distance between the connection wiring and the first via. Alternatively, a portion of the connection wiring close to the first via is bent away from the first via to enlarge the distance between the connection wiring and the first via. It is to prevent the connection wiring from falling into the first via and contacting the TFT layer, and to prevent the top transparent electrode and the bottom transparent electrode from being directly short-circuited, thereby causing poor touch control of the display panel. The touch display panel of the invention can prevent the top transparent electrode and the bottom transparent electrode from being directly short-circuited, thereby causing poor touch control of the display panel.

In view of the above, various other changes and modifications may be made by those skilled in the art, and all such changes and modifications are intended to fall within the scope of the appended claims.

What is claimed is:

1. A touch array substrate, comprising a base substrate, a TFT layer disposed on the base substrate, a flat layer disposed on the TFT layer, a metal wiring layer disposed on the flat layer, an insulating layer disposed on the metal wiring layer, a bottom transparent electrode disposed on the insulating layer, a passivation layer disposed on the bottom transparent electrode and a top transparent electrode disposed on the passivation layer; wherein the TFT layer includes an active layer disposed on the base substrate, a gate insulating layer disposed on the active layer, a gate electrode disposed on the gate insulating layer, an interlayer insulating layer disposed on the gate electrode, and a source electrode and a drain electrode disposed on the interlayer insulating layer;

the active layer includes a channel region under the gate, ion lightly doped regions on both sides of the channel region, and a source contact region and a drain contact region on both sides of the ion lightly doped regions, respectively; the source electrode is in contact with the source contact region through a fifth via penetrating the interlayer insulating layer and the gate insulating layer; and the drain electrode is in contact with the drain contact region through a sixth via penetrating the interlayer insulating layer and the gate insulating layer;

the top transparent electrode is in contact with the TFT layer through a first via penetrating the flat layer, a second via penetrating the insulating layer, and a third via penetrating the passivation layer;

the metal wiring layer includes a touch signal line, a dummy wiring and a connection wiring connecting the touch signal line and the dummy wiring;

the bottom transparent electrode is in contact with the touch signal line through a fourth via penetrating the insulating layer; and the critical dimension of the connection wiring is smaller than the critical dimensions of the touch signal line and the dummy wiring to increase the distance between the connection wiring and the first via, or a portion of the connection wiring close to the first via is bent away from the first via to enlarge the distance between the connection wiring and the first via.

2. The touch array substrate as claimed in claim 1, wherein the bottom transparent electrode includes a plurality of chip electrodes spaced apart from each other, and the dummy wiring is located at a gap between adjacent two chip electrodes.

3. The touch array substrate as claimed in claim 1, wherein the top transparent electrode is in contact with the drain electrode in the TFT layer.

4. The touch array substrate as claimed in claim 1, wherein the base substrate is further provided with a light shielding layer under the active layer.

5. The touch array substrate as claimed in claim 1, wherein the connection wiring is located above the gate electrode.

6. The touch array substrate as claimed in claim 4, wherein the connection wiring includes a first portion connecting the touch signal line, a second portion connecting the dummy wiring, and the third portion connecting the first portion and the second portion and bent away from the first via.

7. The touch array substrate as claimed in claim 6, wherein the first portion and the second portion of the connection wiring are both located above the gate electrode, and the third portion of the connection wiring is located above the light shielding layer.

8. A touch display panel comprising a touch array substrate, said touch array substrate comprising a base substrate, a TFT layer disposed on the base substrate, a flat layer disposed on the TFT layer, a metal wiring layer disposed on the flat layer, an insulating layer disposed on the metal wiring layer, a bottom transparent electrode disposed on the insulating layer, a passivation layer disposed on the bottom transparent electrode and a top transparent electrode disposed on the passivation layer; wherein the TFT layer includes an active layer disposed on the base substrate, a gate insulating layer disposed on the active layer, a gate electrode disposed on the gate insulating layer, an interlayer insulating layer disposed on the gate electrode, and a source electrode and a drain electrode disposed on the interlayer insulating layer;

the active layer includes a channel region under the gate, ion lightly doped regions on both sides of the channel region, and a source contact region and a drain contact region on both sides of the ion lightly doped regions, respectively; the source electrode is in contact with the source contact region through a fifth via penetrating the interlayer insulating layer and the gate insulating layer; and the drain electrode is in contact with the drain contact region through a sixth via penetrating the interlayer insulating layer and the gate insulating layer;

the top transparent electrode is in contact with the TFT layer through a first via penetrating the flat layer, a second via penetrating the insulating layer, and a third via penetrating the passivation layer;

the metal wiring layer includes a touch signal line, a dummy wiring and a connection wiring connecting the touch signal line and the dummy wiring;

the bottom transparent electrode is in contact with the touch signal line through a fourth via penetrating the insulating layer; and the critical dimension of the connection wiring is smaller than the critical dimensions of the touch signal line and the dummy wiring to increase the distance between the connection wiring and the first via, or a portion of the connection wiring close to the first via is bent away from the first via to enlarge the distance between the connection wiring and the first via.

9. The touch display panel as claimed in claim 8, wherein the bottom transparent electrode includes a plurality of chip electrodes spaced apart from each other, and the dummy wiring is located at a gap between adjacent two chip electrodes.

10. The touch display panel as claimed in claim 8, wherein the top transparent electrode is in contact with the drain electrode in the TFT layer.

11. The touch display panel as claimed in claim 8, wherein the base substrate is further provided with a light shielding layer under the active layer.

12. The touch display panel as claimed in claim 8, wherein the connection wiring is located above the gate electrode.

13. The touch display panel as claimed in claim 11, wherein the connection wiring includes a first portion connecting the touch signal line, a second portion connecting the dummy wiring, and the third portion connecting the first portion and the second portion and bent away from the first via.

14. The touch display panel as claimed in claim 13, wherein the first portion and the second portion of the connection wiring are both located above the gate electrode, and the third portion of the connection wiring is located above the light shielding layer.

* * * * *